(12) United States Patent
Li

(10) Patent No.: US 11,183,093 B2
(45) Date of Patent: Nov. 23, 2021

(54) PIXEL ARRANGEMENT STRUCTURE, DISPLAY PANEL, AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventor: Yan Li, Shenzhen (CN)

(*) Notice: Subject to any disclaimer, the term of this patent is extended or adjusted under 35 U.S.C. 154(b) by 0 days.

(21) Appl. No.: 16/764,902

(22) PCT Filed: Apr. 1, 2020

(86) PCT No.: PCT/CN2020/082742
§ 371 (c)(1),
(2) Date: May 18, 2020

(87) PCT Pub. No.: WO2021/184425
PCT Pub. Date: Sep. 23, 2021

(65) Prior Publication Data
US 2021/0295753 A1  Sep. 23, 2021

(30) Foreign Application Priority Data
Mar. 18, 2020 (CN) .......................... 202010191128.6

(51) Int. Cl.
| | |
|---|---|
| *G09G 3/20* | (2006.01) |
| *H01L 27/32* | (2006.01) |
| *H01L 27/15* | (2006.01) |
| *G02F 1/1343* | (2006.01) |

(52) U.S. Cl.
CPC .......... *G09G 3/20* (2013.01); *G02F 1/134309* (2013.01); *H01L 27/156* (2013.01); *H01L 27/3218* (2013.01); *H01L 27/3244* (2013.01); *G02F 1/134345* (2021.01); *G09G 2300/0452* (2013.01); *G09G 2320/02* (2013.01); *G09G 2320/041* (2013.01); *G09G 2340/0457* (2013.01)

(58) Field of Classification Search
CPC ............. H01L 27/3216; H01L 27/3279; H01L 2227/323; G09G 3/3225; G09G 2320/0233; G09G 2320/0242; G09G 2300/0452; G09G 2320/0209
See application file for complete search history.

(56) References Cited

U.S. PATENT DOCUMENTS

2018/0053812 A1*  2/2018  Wacyk ................ H01L 51/0011
2018/0315801 A1*  11/2018  Matsueda ........... H01L 27/3218

* cited by examiner

*Primary Examiner* — Shaheda A Abdin

(57) ABSTRACT

Embodiments of the present disclosure provide a pixel arrangement structure, a display panel, and a display device. The pixel arrangement structure includes at least one repeating pixel group, wherein each of the at least one repeating pixel group includes a first pixel unit, a second pixel unit, a third pixel unit, and a fourth pixel unit. Two sub-pixels of the first pixel unit are adjacent to two sub-pixels of the second pixel unit, and two sub-pixels of the third pixel unit are adjacent to two sub-pixels of the fourth pixel unit, thereby achieving pixel multiplexing.

16 Claims, 4 Drawing Sheets

PIXEL ARRANGEMENT STRUCTURE, DISPLAY PANEL, AND DISPLAY DEVICE

TECHNICAL FIELD

The present disclosure relates to a field of pixel arrangement technology, and in particular, to a pixel arrangement structure, a display panel, and a display device.

BACKGROUND

With continuous development of screens and increasing market demands, high-resolution screens are becoming more and more popular among people. High-definition display means that more information is displayed while image accuracy is improved, and also means that font size is reduced and images are more detailed, but it is more difficult to be viewed from a far distance. In case of outdoors, viewing a screen from a far distance usually reduces customer's comfort, and at the same time, due to the high-resolution screens with increased data amount, data transmission bandwidth is increased. But due to increasing frequencies of data lines of a display panel at a same time, temperatures of the screen and chip on film (COF) will also greatly increase, and the temperatures of some COFs have even reached more than 120° C., seriously affecting use.

In an implementation process, the inventors find that there are at least the following problems in the traditional technology: when a traditional pixel arrangement is compatible with both high-resolution display and low-resolution display, the temperatures of the screen and display elements rise, which may cause rough pictures and even abnormal pictures.

SUMMARY

Based on this, it is necessary to solve the problems that when the traditional pixel arrangement is compatible with both high-resolution display and low-resolution display, the temperatures of the screen and the display elements rise, which may cause rough pictures and even abnormal pictures. Therefore, a pixel arrangement structure, a display panel, and a display device are provided.

To achieve the above purpose, an embodiment of the present disclosure provides a pixel arrangement structure comprising at least one repeating pixel group, wherein each of the at least one repeating pixel group consists of a first pixel unit, a second pixel unit arranged in a same row as the first pixel unit, a third pixel unit arranged in a same column as the first pixel unit, and a fourth pixel unit arranged in a same column as the second pixel unit and in a same row as the third pixel unit, wherein each of the first pixel unit, the second pixel, the third pixel unit, and the fourth pixel unit consists of three sub-pixels, and wherein two of the sub-pixels of the first pixel unit are adjacent to two of the sub-pixels of the second pixel unit, the adjacent sub-pixels are different from each other, two of the sub-pixels of the third pixel unit are adjacent to two of the sub-pixels of the fourth pixel unit, and the adjacent sub-pixels are different from each other.

In another aspect, an embodiment of the present disclosure provides a display panel comprising a pixel arrangement structure, wherein the pixel arrangement structure comprises at least one repeating pixel group, and each of the at least one repeating pixel group consists of a first pixel unit, a second pixel unit arranged in a same row as the first pixel unit, a third pixel unit arranged in a same column as the first pixel unit, and a fourth pixel unit arranged in a same column as the second pixel unit and in a same row as the third pixel unit, wherein each of the first pixel unit, the second pixel, the third pixel unit, and the fourth pixel unit consists of three sub-pixels, and wherein two of the sub-pixels of the first pixel unit are adjacent to two of the sub-pixels of the second pixel unit, the adjacent sub-pixels are different from each other, two of the sub-pixels of the third pixel unit are adjacent to two of the sub-pixels of the fourth pixel unit, and the adjacent sub-pixels are different from each other.

In another aspect, an embodiment of the present disclosure provides a display device comprising a display panel comprising a pixel arrangement structure, wherein the pixel arrangement structure comprises at least one repeating pixel group, and each of the at least one repeating pixel group consists of a first pixel unit, a second pixel unit arranged in a same row as the first pixel unit, a third pixel unit arranged in a same column as the first pixel unit, and a fourth pixel unit arranged in a same column as the second pixel unit and in a same row as the third pixel unit, wherein each of the first pixel unit, the second pixel, the third pixel unit, and the fourth pixel unit consists of three sub-pixels, and wherein two of the sub-pixels of the first pixel unit are adjacent to two of the sub-pixels of the second pixel unit, the adjacent sub-pixels are different from each other, two of the sub-pixels of the third pixel unit are adjacent to two of the sub-pixels of the fourth pixel unit, and the adjacent sub-pixels are different from each other.

In the above embodiments of the pixel arrangement structure, the second pixel unit is arranged in a same row as the first pixel unit, the third pixel unit is arranged in a same column as the first pixel unit, and the fourth pixel unit is arranged in a same column as the second pixel unit and in a same row as the third pixel unit, wherein two of the sub-pixels of the first pixel unit are adjacent to two of the sub-pixels of the second pixel unit, the adjacent sub-pixels are different from each other, two of the sub-pixels of the third pixel unit are adjacent to two of the sub-pixels of the fourth pixel unit, and the adjacent sub-pixels are different from each other. Thereby, the sub-pixels of the pixel group can be used by two or more of the pixel units, so that the four pixel units in the pixel group can be used as eight pixels to achieve pixel multiplexing, thus achieving compatibility with both high-resolution display and low-resolution display, preventing temperature of screen and display elements from rising, and improving display quality of pictures.

BRIEF DESCRIPTION OF DRAWINGS

The following will be combined with the accompany drawings and the embodiments to further explain the present disclosure. In the drawings.

DETAILED DESCRIPTION OF PREFERRED EMBODIMENTS

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure.

In the present disclosure, it should be stated that, orientational or positional relationships represented by directional terms mentioned in the present disclosure, such as central, up, down, left, right, vertical, horizontal, inside, outside, etc., are orientational or positional relationships based on the drawings, and are merely for the convenience of describing the present disclosure and simplifying the description, rather than indicating or implying that the device or element is intended to have a particular orientation, or is constructed and operated in a particular orientation, and therefore, should not be interpreted as a limitation of the application. In addition, terms such as "first", "second", and "third" are used herein for purposes of description, and should not be interpreted as indication or implication of relative importance, or implied indication of a number of the technical features.

In the description of the present disclosure, it should be stated that, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

Embodiments of the present disclosure will be described in detail hereinafter with reference to the accompanying drawings. It should be understood that the embodiments described herein are intended to explain and interpret the present disclosure and are not intended to limit the present disclosure.

Please refer to FIG. 1, FIG. 2, FIG. 3, FIG. 4, FIG. 5, FIG. 6, and FIG. 7 for details of a pixel arrangement structure, a display panel and a display device provided in the embodiments of the present disclosure in combination with the accompany drawings.

Figure 1:
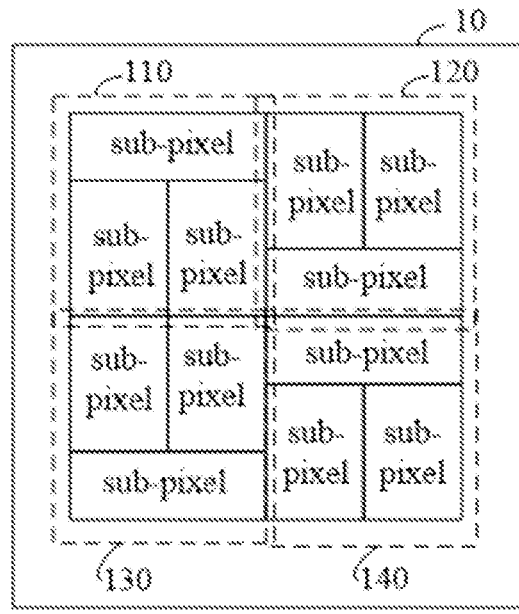
FIG. 1 is a first schematic structural diagram illustrating a pixel arrangement structure according to an embodiment of the present disclosure.

In order to solve the problems that when the traditional pixel arrangement is compatible with both high-resolution display and low-resolution display, the temperatures of the screen and the display elements rise, which may cause rough pictures and even abnormal pictures, as shown in FIG. 1, an embodiment provides a pixel arrangement structure comprising at least one repeating pixel group 10. Each of the at least one repeating pixel group 10 consists of a first pixel unit 110, a second pixel unit 120 arranged in a same row as the first pixel unit 110, a third pixel unit 130 arranged in a same column as the first pixel unit 110, and a fourth pixel unit 140 arranged in a same column as the second pixel unit 120 and in a same row as the third pixel unit 130.

Each of the first pixel unit 110, the second pixel 120, the third pixel unit 130, and the fourth pixel unit 140 consists of three sub-pixels, wherein two of the sub-pixels of the first pixel unit 110 are adjacent to two of the sub-pixels of the second pixel unit 120, the adjacent sub-pixels are different from each other, two of the sub-pixels of the third pixel 130 unit are adjacent to two of the sub-pixels of the fourth pixel unit 140, and the adjacent sub-pixels are different from each other.

Wherein the repeating pixel group 10 refers to a pixel group which constitutes a repeating pixel area in the pixel arrangement structure. A repeating pixel group 10 can consist original translation of a plurality of pixels. The first pixel unit 110 can consist of three sub-pixels, which consist of RGB pixels (namely, a red sub-pixel, a green sub-pixel, and a blue sub-pixel). The second pixel unit 120 can consist of three sub-pixels, which consist of RGB pixels (namely, a red sub-pixel, a green sub-pixel, and a blue sub-pixel). The third pixel unit 130 can consist of three sub-pixels, which consist of RGB pixels (namely, a red sub-pixel, a green sub-pixel, and a blue sub-pixel). The fourth pixel unit 140 can consist of three sub-pixels, which consist of RGB pixels (namely, a red sub-pixel, a green sub-pixel, and a blue sub-pixel).

In detail, the first pixel unit 110 and the second pixel unit 120 are arranged in a same row, the first pixel unit 110 and the third pixel unit 130 are arranged in a same column, and the fourth pixel unit 140 is arranged in a same column as the second pixel unit 120 and in a same row as the third pixel unit 130. Further, the repeating pixel group consisting of the first pixel unit 110, the second pixel unit 120, the third pixel unit 130, and the fourth pixel unit 140 is rectangular. Sizes of the first pixel unit 110, the second pixel unit 120, the third pixel unit 130 and the fourth pixel unit 140 are same. In an embodiment, the repeating pixel group 10 is square.

Further, the first pixel unit 110 can consist of three sub-pixels and can be rectangular. In an embodiment, the first pixel unit 110 is square. The second pixel unit 120 can consist of three sub-pixels and can be rectangular. In an embodiment, the second pixel unit 120 is square. The third pixel unit 130 can consist of three sub-pixels and can be rectangular. In an embodiment, the third pixel unit 130 is square. The fourth pixel unit 140 can consist of three sub-pixels and can be rectangular. In an embodiment, the fourth pixel unit 140 is square.

Two of the sub-pixels of the first pixel unit 110 are adjacent to two of the sub-pixels of the second pixel unit 120, and the adjacent sub-pixels are different from each other. Two of the sub-pixels of the third pixel 130 unit are adjacent to two of the sub-pixels of the fourth pixel unit 140, and the adjacent sub-pixels are different from each other.

For example, the green sub-pixel consisted in the first pixel unit 110 is adjacent to the red sub-pixel consisted in the second pixel unit 120, and the blue sub-pixel consisted in the first pixel unit 110 is adjacent to the red sub-pixel and the green sub-pixel consisted in the second pixel unit 120. The red sub-pixel consisted in the third pixel unit 130 is adjacent to the green sub-pixel and the blue sub-pixel consisted in the fourth pixel unit 140, and the green sub-pixel consisted in the third pixel unit 130 is adjacent to the blue sub-pixel consisted in the fourth pixel unit 140. Thereby, the sub-pixels of each pixel unit can be multiplexed by other pixel units to form new pixel units. The first pixel unit 110 and the second pixel unit 120 form four pixel units by multiplexing the sub-pixels, and the third pixel unit 130 and the fourth pixel unit 140 form four pixel units by multiplexing the sub-pixels, thus achieving a high-resolution display effect through a low-resolution display panel and improving picture quality.

In an embodiment, the first pixel unit 110, the second pixel unit 120, the third pixel unit 130, and the fourth pixel unit 140 are closely arranged to each other.

It should be stated that positions and area ratios of the sub-pixels consisted in each pixel unit can be adjusted according to an actual display effect and a functional requirement of the display panel.

In the above embodiments of the pixel arrangement structure, the second pixel unit is arranged in a same row as the first pixel unit, the third pixel unit is arranged in a same column as the first pixel unit, and the fourth pixel unit is arranged in a same column as the second pixel unit and in a same row as the third pixel unit, wherein two of the sub-pixels of the first pixel unit are adjacent to two of the sub-pixels of the second pixel unit, the adjacent sub-pixels are different from each other, two of the sub-pixels of the third pixel unit are adjacent to two of the sub-pixels of the fourth pixel unit, and the adjacent sub-pixels are different from each other. Thereby, the sub-pixels of the pixel group can be used by two or more of the pixel units, so that the four pixel units in the pixel group can be used as eight pixels to achieve pixel multiplexing, thus achieving compatibility with both high-resolution display and low-resolution display, applicable to various scenarios, effectively reducing temperatures of the display panel and the display elements at the same time, greatly improving display reliability, and improving display quality.

Figure 2:
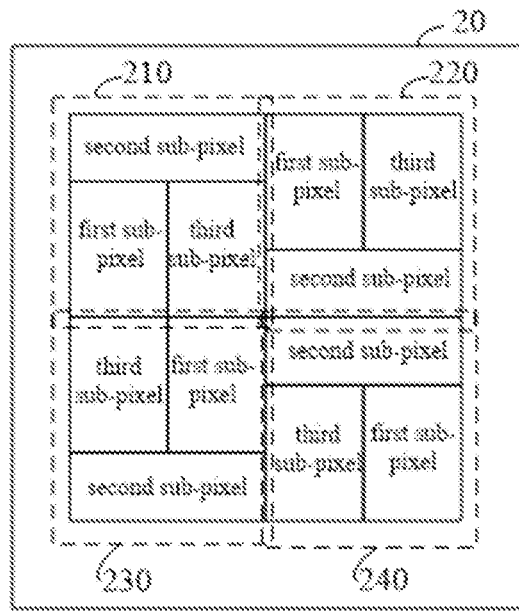
FIG. 2 is a second schematic structural diagram illustrating a pixel arrangement structure according to an embodiment of the present disclosure.

In an embodiment, as shown in FIG. 2, a pixel arrangement structure is provided and comprises at least one repeating pixel group 20. Each of the at least one repeating pixel group 20 consists of a first pixel unit 210, a second pixel unit 220 arranged in a same row as the first pixel unit 210, a third pixel unit 230 arranged in a same column as the first pixel unit 210, and a fourth pixel unit 240 arranged in a same column as the second pixel unit 220 and in a same row as the third pixel unit 230.

Each of the first pixel unit 210, the second pixel unit 220, the third pixel unit 230, and the fourth pixel unit 240 consists of a first sub-pixel, a second sub-pixel, and a third sub-pixel. The first sub-pixel, the second sub-pixel, and the third sub-pixel are bar-shaped.

In detail, the bar-shaped first sub-pixel can be rectangular, the bar-shaped second sub-pixel can be rectangular, and the bar-shaped third sub-pixel can be rectangular.

In a specific embodiment, as shown in FIG. 2, a length of a long edge of the second sub-pixel is equal to a sum of a width of a short edge of the first sub-pixel and a width of a short edge of the third sub-pixel.

In detail, the sum of the width of the short edge of the first sub-pixel and the width of the short edge of the third sub-pixel is equal to the length of the long edge of the second sub-pixel. Further, the width of the short edge of the first sub-pixel is equal to the width of the short edge of the third sub-pixel.

In an embodiment, a length of a long edge of the first sub-pixel is twice the width of the short edge of the first sub-pixel, the length of the long edge of the second sub-pixel is twice a width of a short edge of the second sub-pixel, and a length of a long edge of the third sub-pixel is twice the width of the short edge of the third sub-pixel.

In a specific embodiment, as shown in FIG. 2, in a same pixel unit the long edge of the second sub-pixel extends along a row direction, and long edges of the first sub-pixel and the third sub-pixel extend along a column direction.

In detail, in the first pixel unit 210 the long edge of the second sub-pixel extends along a row direction, and the long edges of the first sub-pixel and the third sub-pixel extend along a column direction. In the second pixel 220 the long edge of the second sub-pixel extends along a row direction, and the long edges of the first sub-pixel and the third sub-pixel extend along a column direction. In the third pixel unit 230 the long edge of the second sub-pixel extends along a row direction, and the long edges of the first sub-pixel and the third sub-pixel extend along a column direction. In the fourth pixel unit 240 the long edge of the second sub-pixel extends along a row direction, and the long edges of the first sub-pixel and the third sub-pixel extend along a column direction.

In a specific embodiment, as shown in FIG. 2, in a same pixel unit the first sub-pixel and the third sub-pixel are arranged side by side, and the short edges of the first sub-pixel and the third sub-pixel overlap the long edge of the second sub-pixel.

In detail, in the first pixel unit 210, the first sub-pixel and the third sub-pixel are arranged side by side, and the short edges of the first sub-pixel and the third sub-pixel overlap the long edge of the second sub-pixel. In the second pixel unit 220, the first sub-pixel and the third sub-pixel are arranged side by side, and the short edges of the first sub-pixel and the third sub-pixel overlap the long edge of the second sub-pixel. In the third pixel unit 230, the first sub-pixel and the third sub-pixel are arranged side by side, and the short edges of the first sub-pixel and the third sub-pixel overlap the long edge of the second sub-pixel. In the fourth pixel unit 240, the first sub-pixel and the third sub-pixel are arranged side by side, and the short edges of the first sub-pixel and the third sub-pixel overlap the long edge of the second sub-pixel.

In a specific embodiment, as shown in FIG. 2, areas of the first sub-pixel, the second sub-pixel, and the third sub-pixel are equal to each other.

In detail, the lengths of the long edges of the first sub-pixel, the second sub-pixel, and the third sub-pixel are equal to each other, and the widths of the short edges of the first sub-pixel, the second sub-pixel, and the third sub-pixel are equal to each other.

In the above embodiments of the pixel arrangement structure, the second pixel unit is arranged in a same row as the first pixel unit, the third pixel unit is arranged in a same column as the first pixel unit, and the fourth pixel unit is arranged in a same column as the second pixel unit and in a same row as the third pixel unit, wherein two of the sub-pixels (any two of the first pixel, the second pixel, and the third pixel) of the first pixel unit are adjacent to two of the sub-pixels (any two of the first pixel, the second pixel, and the third pixel) of the second pixel unit, the adjacent sub-pixels are different from each other, two of the sub-pixels (any two of the first pixel, the second pixel, and the third pixel) of the third pixel unit are adjacent to two of the sub-pixels (any two of the first pixel, the second pixel, and the third pixel) of the fourth pixel unit, and the adjacent sub-pixels are different from each other. Thereby, the sub-pixels of the pixel group can be used by two or more of the pixel units, so that the four pixel units in the pixel group can be used as eight pixels to achieve pixel multiplexing, thus achieving compatibility with both high-resolution display and low-resolution display, preventing temperatures of the screen and the display elements from rising, and improving display quality of pictures.

Figure 3:
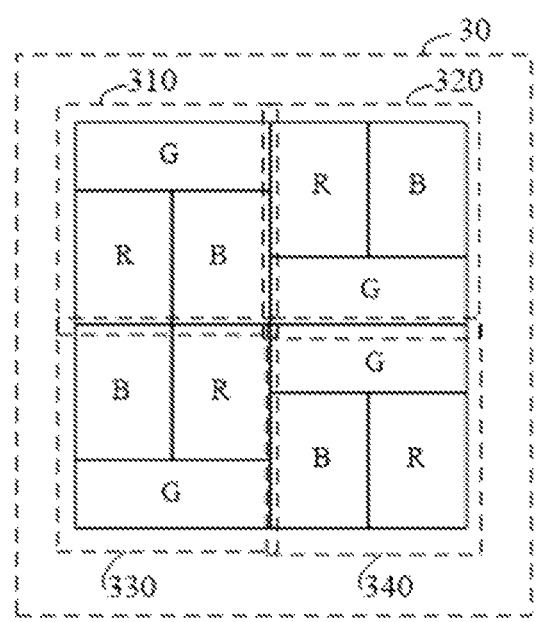
FIG. 3 is a third schematic structural diagram illustrating a pixel arrangement structure according to an embodiment of the present disclosure.

In an embodiment, as shown in FIG. 3, a pixel arrangement structure is provided and comprises at least one repeating pixel group 30. Each of the at least one repeating pixel group 30 consists of a first pixel unit 310, a second pixel unit 320 arranged in a same row as the first pixel unit 310, a third pixel unit 330 arranged in a same column as the first pixel unit 310, and a fourth pixel unit 340 arranged in a same column as the second pixel unit 320 and in a same row as the third pixel unit 330. The first sub-pixel is a red sub-pixel, the second sub-pixel is a green sub-pixel, and the third sub-pixel is a blue sub-pixel.

In detail, the first pixel unit 310 and the second pixel unit 320 are arranged in a same row, the first pixel unit 310 and the third pixel unit 330 are arranged in a same column, and the fourth pixel unit 340 is arranged in a same column with the second pixel unit 320 and in a same row with the third pixel unit 330. In a same pixel unit (any one of the first pixel unit 310, the second pixel unit 320, the third pixel unit 330, and the fourth pixel unit 340), a long edge of the green sub-pixel extends along a row direction, and long edges of the red sub-pixel and the blue sub-pixel extend along a column direction. The red sub-pixel and the blue sub-pixel are arranged side by side, and short edges of the red sub-pixel and the blue sub-pixel overlap the long edge of the second sub-pixel.

The green sub-pixel of the first pixel unit 310 is adjacent to the red sub-pixel of the second pixel unit 320, and the blue sub-pixel of the first pixel unit 310 is adjacent to the red sub-pixel and the green sub-pixel of the second pixel unit 320. The red sub-pixel of the third pixel unit 330 is adjacent to the green sub-pixel and the blue sub-pixel of the fourth pixel unit 340, and the green sub-pixel of the third pixel unit 330 is adjacent to the blue sub-pixel of the fourth pixel unit 340. Thereby, the sub-pixels of the pixel units can be used by two or more of the pixel units, so that the four pixel units in the pixel group can be used as eight pixels to achieve pixel multiplexing.

The above embodiments solve the problems that the traditional pixel arrangement cannot realize pixel multiplexing, so when displaying high-resolution pictures with low-resolution display panel, there will be no more fine display effect, but more information will be lost and pictures will be rough or even abnormal. It can achieve both low-resolution display and high-resolution display at the same time, prevent temperatures of the screen and the display elements from rising, and not only can display with a high-resolution effect but also improve display quality of pictures.

Figure 4:
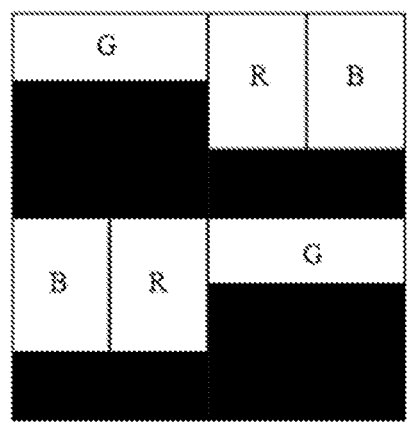
FIG. 4 is a schematic structural diagram illustrating a lateral resolution of a pixel arrangement structure corresponding to an 8K display resolution according to an embodiment of the present disclosure.
Figure 5:
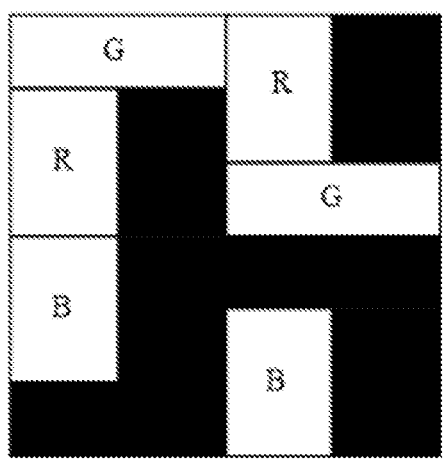
FIG. 5 is a schematic structural diagram illustrating a longitudinal resolution of a pixel arrangement structure corresponding to an 8K resolution according to an embodiment of the present disclosure.

In an embodiment, 8K display is taken as an example. Based on the pixel arrangement structure in the present disclosure, a display panel with a resolution of 3840*2160 can display a picture with a resolution of 7680*4320, and the display effect of the display panel can be improved. Based on the pixel arrangement structure in the present disclosure, pixels in one row can display information of two rows through pixel multiplexing, wherein a horizontal resolution is shown in FIG. 4 and a longitudinal resolution is shown in FIG. 5.

It should be noted that due to pixel multiplexing, a displayed straight line is not as straight as that displayed by a traditional 8K screen. However, due to the pursuit of higher and higher pixels per inch (PPI, namely pixel density) in the display industry, which can even reach up to 2000 PPI, human eyes are unable to identify a sawtooth of 0.004 mm, so it will not affect a display effect. At the same time, if it is a product of low PPI, there is usually a display distance requirement; for example, an LED screen of 120 inches generally has an effective viewing distance of 1.2 m. Beyond the normal viewing distance of 1.2 m, unevenness of 0.1 mm cannot be detected by the user. Therefore, the display quality is not affected.

Figure 6:
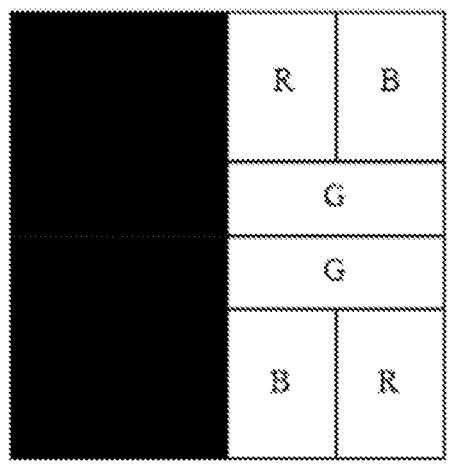
FIG. 6 is a schematic structural diagram illustrating a lateral resolution of a pixel arrangement structure corresponding to a 4K resolution according to an embodiment of the present disclosure.
Figure 7:
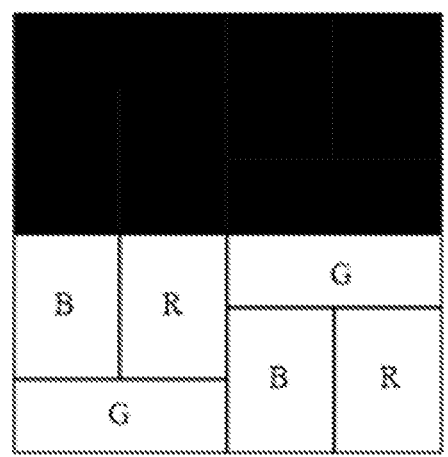
FIG. 7 is a schematic structural diagram illustrating a longitudinal resolution of a pixel arrangement structure corresponding to a 4K resolution according to an embodiment of the present disclosure.

In an embodiment, 4K display is taken as an example. Based on the pixel arrangement structure in the present disclosure, a display panel with a resolution of 3840*2160 can display a picture with a resolution of 3840*2160, and the display effect of the display panel can be improved. Based on the pixel arrangement structure in the present disclosure, pixels in one row can display information of two rows through pixel multiplexing, wherein a horizontal resolution is shown in FIG. 6 and a longitudinal resolution is shown in FIG. 7.

It should be noted that, as shown in FIG. 3 to FIG. 7, R refers to a red sub-pixel, G refers to a green sub-pixel, B refers to a blue sub-pixel, and a black block refers to a black sub-pixel.

In an embodiment, a display panel is provided and comprises any one of the above pixel arrangement structures.

In detail, based on the above pixel arrangement structure, the display panel in the embodiments of the present disclosure can achieve compatibility with both high-resolution display and low-resolution display, display high-resolution pictures by a low-resolution display panel, be applicable to various scenarios, effectively reduce temperatures of the display panel and the display elements at the same time, greatly improve display reliability, and improve display quality.

It should be noted that, for specific descriptions of the display panel, see the above descriptions of the pixel arrangement structure, and details are not further described herein.

In an embodiment, a display device is provided and comprises the above display panel.

In detail, based on the above display panel and pixel arrangement structure, the display device in the embodiments of the present disclosure can achieve compatibility with both high-resolution display and low-resolution display, display high-resolution pictures by a low-resolution display panel, be applicable to various scenarios, effectively reduce temperatures of the display panel and the display elements at the same time, greatly improve display reliability, and improve display quality.

In a specific embodiment, the display panel is an LCD display panel, an AMOLED display panel, or an LED display panel.

It should be noted that the display panel is not limited to be an LCD display panel, an AMOLED display panel, or an LED display panel. The display panel can be an OLED display panel, a micro-LED display panel, or a mini-LED display panel.

Technical features of the foregoing embodiments may be combined. For brevity of description, not all possible combinations of the technical features in the foregoing embodiments are described. However, these combinations shall fall within the scope recorded in this specification as long as the combinations have no conflict.

The foregoing embodiments are merely some embodiments of the present invention, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements belong to the protection scope of the present disclosure. Therefore, the protection scope of the present disclosure shall be subject to the protection scope of the appended claims.

What is claimed is:

1. A pixel arrangement structure comprising at least one repeating pixel group, wherein each of the at least one repeating pixel group consists of:
   a first pixel unit;
   a second pixel unit arranged in a same row as the first pixel unit;
   a third pixel unit arranged in a same column as the first pixel unit; and
   a fourth pixel unit arranged in a same column as the second pixel unit and in a same row as the third pixel unit;
   wherein each of the first pixel unit, the second pixel unit, the third pixel unit, and the fourth pixel unit consists of three sub-pixels;
   wherein two of the sub-pixels of the first pixel unit are adjacent to two of the sub-pixels of the second pixel unit to encompass four adjacent sub-pixels of the first pixel unit and the second pixel unit, and in the four adjacent sub-pixels of the first pixel unit and the second pixel unit, the sub-pixels adjacent to each other by side to side are different from each other; and
   two of the sub-pixels of the third pixel unit are adjacent to two of the sub-pixels of the fourth pixel unit to encompass four adjacent sub-pixels of the third pixel unit and the fourth pixel unit, and in the four adjacent sub-pixels of the third pixel unit and the fourth pixel unit, the sub-pixels adjacent to each other by side to side are different from each other.

2. The pixel arrangement structure as claimed in claim 1, wherein each of the first pixel unit, the second pixel, the third pixel unit, and the fourth pixel unit consists of a first sub-pixel, a second sub-pixel, and a third sub-pixel, and the first sub-pixel, the second sub-pixel, and the third sub-pixel are bar-shaped.

3. The pixel arrangement structure as claimed in claim 2, wherein a length of a long side of the second sub-pixel is equal to a sum of a width of a short side of the first sub-pixel and a width of a short side of the third sub-pixel.

4. The pixel arrangement structure as claimed in claim 3, wherein in a same pixel unit, the long side of the second sub-pixel extends along a row direction, and long sides of the first sub-pixel and the third sub-pixel extend along a column direction.

5. The pixel arrangement structure as claimed in claim 4, wherein in the same pixel unit, the first sub-pixel and the third sub-pixel are arranged side by side, and the short sides of the first sub-pixel and the third sub-pixel overlap the long side of the second sub-pixel.

6. The pixel arrangement structure as claimed in claim 4, wherein areas of the first sub-pixel, the second sub-pixel, and the third sub-pixel are equal to each other.

7. The pixel arrangement structure as claimed in claim 2, wherein the first sub-pixel is a red sub-pixel, the second sub-pixel is a green sub-pixel, and the third sub-pixel is a blue sub-pixel.

8. A display panel comprising a pixel arrangement structure, wherein the pixel arrangement structure comprises at least one repeating pixel group, and each of the at least one repeating pixel group consists of:
   a first pixel unit;
   a second pixel unit arranged in a same row as the first pixel unit;
   a third pixel unit arranged in a same column as the first pixel unit; and
   a fourth pixel unit arranged in a same column as the second pixel unit and in a same row as the third pixel unit;
   wherein each of the first pixel unit, the second pixel unit, the third pixel unit, and the fourth pixel unit consists of three sub-pixels;
   wherein two of the sub-pixels of the first pixel unit are adjacent to two of the sub-pixels of the second pixel unit to encompass four adjacent sub-pixels of the first pixel unit and the second pixel unit, and in the four adjacent sub-pixels of the first pixel unit and the second pixel unit, the sub-pixels adjacent to each other by side to side are different from each other; and
   two of the sub-pixels of the third pixel unit are adjacent to two of the sub-pixels of the fourth pixel unit to encompass four adjacent sub-pixels of the third pixel unit and the fourth pixel unit, and in the four adjacent sub-pixels of the third pixel unit and the fourth pixel unit, the sub-pixels adjacent to each other by side to side are different from each other.

9. The display panel as claimed in claim 8, wherein each of the first pixel unit, the second pixel, the third pixel unit, and the fourth pixel unit consists of a first sub-pixel, a second sub-pixel, and a third sub-pixel, and the first sub-pixel, the second sub-pixel, and the third sub-pixel are bar-shaped.

10. The display panel as claimed in claim 9, wherein a length of a long side of the second sub-pixel is equal to a sum of a width of a short side of the first sub-pixel and a width of a short side of the third sub-pixel.

11. The display panel as claimed in claim 10, wherein in a same pixel unit, the long side of the second sub-pixel extends along a row direction, and long sides of the first sub-pixel and the third sub-pixel extend along a column direction.

12. The display panel as claimed in claim 11, wherein in the same pixel unit, the first sub-pixel and the third sub-pixel are arranged side by side, and the short sides of the first sub-pixel and the third sub-pixel overlap the long side of the second sub-pixel.

13. The display panel as claimed in claim 11, wherein areas of the first sub-pixel, the second sub-pixel, and the third sub-pixel are equal to each other.

14. The display panel as claimed in claim 9, wherein the first sub-pixel is a red sub-pixel, the second sub-pixel is a green sub-pixel, and the third sub-pixel is a blue sub-pixel.

15. A display device comprising a display panel comprising a pixel arrangement structure, wherein the pixel arrangement structure comprises at least one repeating pixel group, and each of the at least one repeating pixel group consists of:
   a first pixel unit;
   a second pixel unit arranged in a same row as the first pixel unit;
   a third pixel unit arranged in a same column as the first pixel unit; and
   a fourth pixel unit arranged in a same column as the second pixel unit and in a same row as the third pixel unit;
   wherein each of the first pixel unit, the second pixel unit, the third pixel unit, and the fourth pixel unit consists of three sub-pixels;
   wherein two of the sub-pixels of the first pixel unit are adjacent to two of the sub-pixels of the second pixel unit to encompass four adjacent sub-pixels of the first pixel unit and the second pixel unit, and in the four adjacent sub-pixels of the first pixel unit and the second pixel unit, the sub-pixels adjacent to each other by side to side are different from each other; and two of the sub-pixels of the third pixel unit are adjacent to two of the sub-pixels of the fourth pixel unit to encompass four adjacent sub-pixels of the third pixel unit and the fourth pixel unit, and in the four adjacent sub-pixels of the third pixel unit and the fourth pixel unit, the sub-pixels adjacent to each other by side to side are different from each other.

16. The display device as claimed in claim 15, wherein the display panel is an LCD display panel, an AMOLED display panel, or an LED display panel.

* * * * *